US011999249B2

(12) United States Patent
Simonazzi

(10) Patent No.: US 11,999,249 B2
(45) Date of Patent: Jun. 4, 2024

(54) BATTERY CHARGER FOR VEHICLES AND RELATIVE REALIZATION PROCESS

(71) Applicant: META SYSTEM S.p.A., Reggio Emilia (IT)

(72) Inventor: Giuseppe Simonazzi, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 378 days.

(21) Appl. No.: 17/261,807

(22) PCT Filed: Jul. 17, 2019

(86) PCT No.: PCT/IB2019/056115
§ 371 (c)(1),
(2) Date: Jan. 20, 2021

(87) PCT Pub. No.: WO2020/016802
PCT Pub. Date: Jan. 23, 2020

(65) Prior Publication Data
US 2021/0276438 A1    Sep. 9, 2021

(30) Foreign Application Priority Data

Jul. 20, 2018  (IT) .......................... 102018000007376

(51) Int. Cl.
*B60L 53/20*     (2019.01)
*H02J 7/00*      (2006.01)
*H05K 7/14*      (2006.01)

(52) U.S. Cl.
CPC ............ *B60L 53/20* (2019.02); *H02J 7/0045* (2013.01); *H05K 7/14322* (2022.08); *H02J 2310/48* (2020.01); *Y02T 10/7072* (2013.01)

(58) Field of Classification Search
CPC ..... B60L 53/20; H02J 7/0045; H02J 2310/48; H05K 7/14322
USPC .......................................... 320/107, 104, 112
See application file for complete search history.

(56) References Cited

U.S. PATENT DOCUMENTS

| | | | |
|---|---|---|---|
| 2013/0235527 A1* | 9/2013 | Wagner ................ | H05K 1/0203 29/832 |
| 2014/0192496 A1* | 7/2014 | Tramet ............... | H05K 7/14322 361/752 |
| 2015/0351226 A1* | 12/2015 | Lasagni ................. | H05K 1/181 29/830 |
| 2017/0182896 A1* | 6/2017 | Masip ................ | H05K 7/14322 |

FOREIGN PATENT DOCUMENTS

| | | |
|---|---|---|
| DE | 100 39 110 A1 | 4/2001 |
| EP | 2 792 045 B1 | 2/2017 |
| EP | 3 240 159 A1 | 11/2017 |
| WO | WO 2014/027536 A1 | 2/2014 |

* cited by examiner

*Primary Examiner* — Edward Tso
*Assistant Examiner* — Aaron Piggush
(74) *Attorney, Agent, or Firm* — ASLAN LAW, P.C.

(57) ABSTRACT

A battery charger for vehicles comprises one outer container, an electronic board housed inside the container, operatively connectable to an electric battery of a vehicle and configured for the recharge of the battery, at least an electric component connected to the electronic board, and at least a support for housing the electric component, in which the support comprises an electric connection device/unit/component between the electric component and the electronic board.

8 Claims, 4 Drawing Sheets

BATTERY CHARGER FOR VEHICLES AND RELATIVE REALIZATION PROCESS

CROSS-REFERENCE TO RELATED APPLICATIONS

This application is a National Stage Entry of PCT/IB2019/056115 filed on Jul. 17, 2019. This application claims priority to IT Patent Application No. 102018000007376 filed on Jul. 20, 2018, and to PCT Application No. PCT/IB2019/056115 filed on Jul. 17, 2019, the entire contents of which are hereby incorporated by reference.

TECHNICAL FIELD

The present invention relates to a battery charger for vehicles and to the relative realization process.

BACKGROUND ART

With particular reference to the field of electric or hybrid vehicles, it is essential to employ power electronic appliances installed on board of vehicles for the conversion of an input voltage/current into a suitable output voltage/current, such as OBC (On-Board Charger) battery chargers or DC-DC converters.

Battery chargers for vehicles of known type generally comprise one or more power or control boards, consisting of one or more printed circuit boards.

The printed circuit boards can be made on a support made of an electrically insulating material such as epoxy-glass or on a metal support of the IMS (Insulated Metal Substrate) type.

It should be noticed, in particular, that in the field of the realization of battery chargers for vehicles, the use is preferred of printed circuit boards with a metal support because it allows achieving high thermal efficiency, due to the thermal dissipation characteristics of the metal used (generally aluminum).

The battery chargers must necessarily comprise large electric wound components (for powers in the order of kW) consisting of components such as transformers, filters and inductors.

According to a known solution, these large electric wound components are grouped in special modules comprising a special housing support. These additional modules are generally necessary since the wound components, precisely because of their large size, are difficult to be directly fixed to the printed circuit board.

Similar considerations also apply to components such as large capacitors.

With particular reference to the printed circuit board with epoxy-glass support, in fact, the fixing of the components wound directly on the support would give the printed circuit board low mechanical strength, negatively and substantially affecting the life span of the battery charger.

Furthermore, with reference to the use of a printed circuit board with a metal support of the IMS type, to the problem of low mechanical strength is added the fact that the fixing of the components wound on the support would require the drilling of the support itself, with a consequent high risk of electric short circuits.

It is known, in fact, that the supports of the IMS type comprise a metal plate, commonly made of aluminum, covered with a thin layer of dielectric material on which the copper tracks are made.

Therefore, drilling the support for fixing a wound component would mean making a possible electric connection between the wound component itself and the aluminum of the support, thus creating a short circuit.

In the battery chargers of known type, therefore, the module with the electric wound components is connected to the printed circuit board by means of special electric cables and both are fixed inside a special container or in different containers.

This known solution has, however, several drawbacks.

In fact, it is necessary to connect each of the wound components present on a module at precise and different points of the circuit board and it is difficult to take the wires of each of the wound components to make the correct connection thereof.

Consequently, the complexity of these connections makes assembly more difficult and, at the same time, increases the possibility of connecting errors or, in any case, the possibility of creating connections that are not sufficiently "strong" over time during normal use of the battery charger.

DESCRIPTION OF THE INVENTION

The main aim of the present invention is to devise a battery charger for vehicles and a relative realization process that allow simplifying the assembly operations of the battery charger itself, in particular of large electric components, such as wound components or capacitors.

Another object of the present invention is to devise a battery charger for vehicles and a relative realization process that allow avoiding connecting errors of the electric wound components.

Another object of the present invention is to devise a battery charger for vehicles and a relative realization process that allow overcoming the aforementioned drawbacks of the prior art within a simple, rational, easy, effective to use and low cost solution.

The aforementioned objects are achieved by the present battery charger for vehicles according to at least one embodiment of the invention.

The aforementioned objects are also achieved by the present process for the realization of a battery charger for vehicles according to at least one embodiment of the invention.

BRIEF DESCRIPTION OF THE DRAWINGS

Other characteristics and advantages of the present invention will be more evident from the description of a preferred, but not exclusive, embodiment of a battery charger for vehicles and of a relative realization process, illustrated by way of an indicative, but non-limiting example, in the attached tables of drawings in which.

EMBODIMENTS OF THE INVENTION

Figure 1:
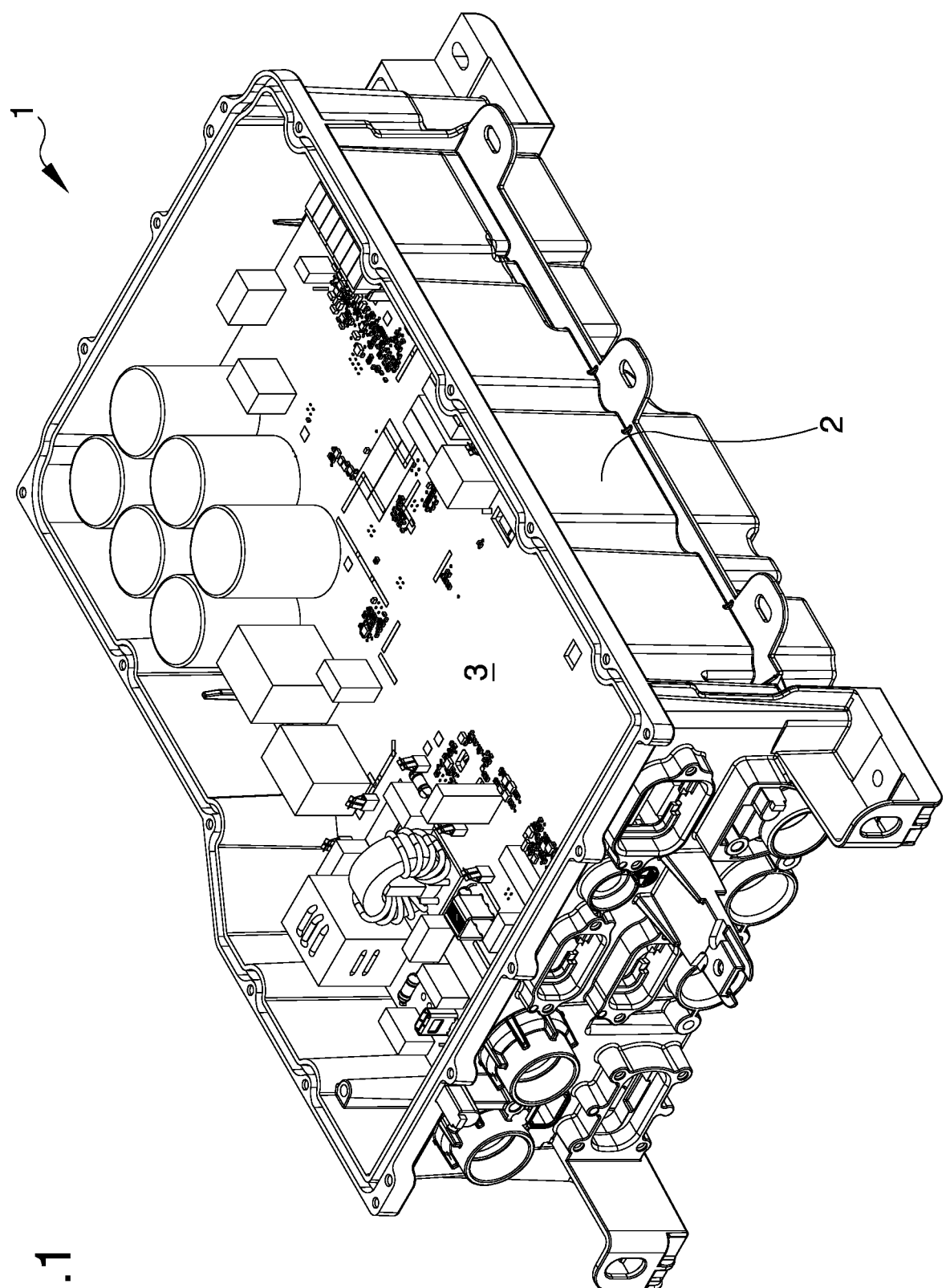
FIG. 1 is an overall view of a possible embodiment of a battery charger according to the invention.
Figure 2:
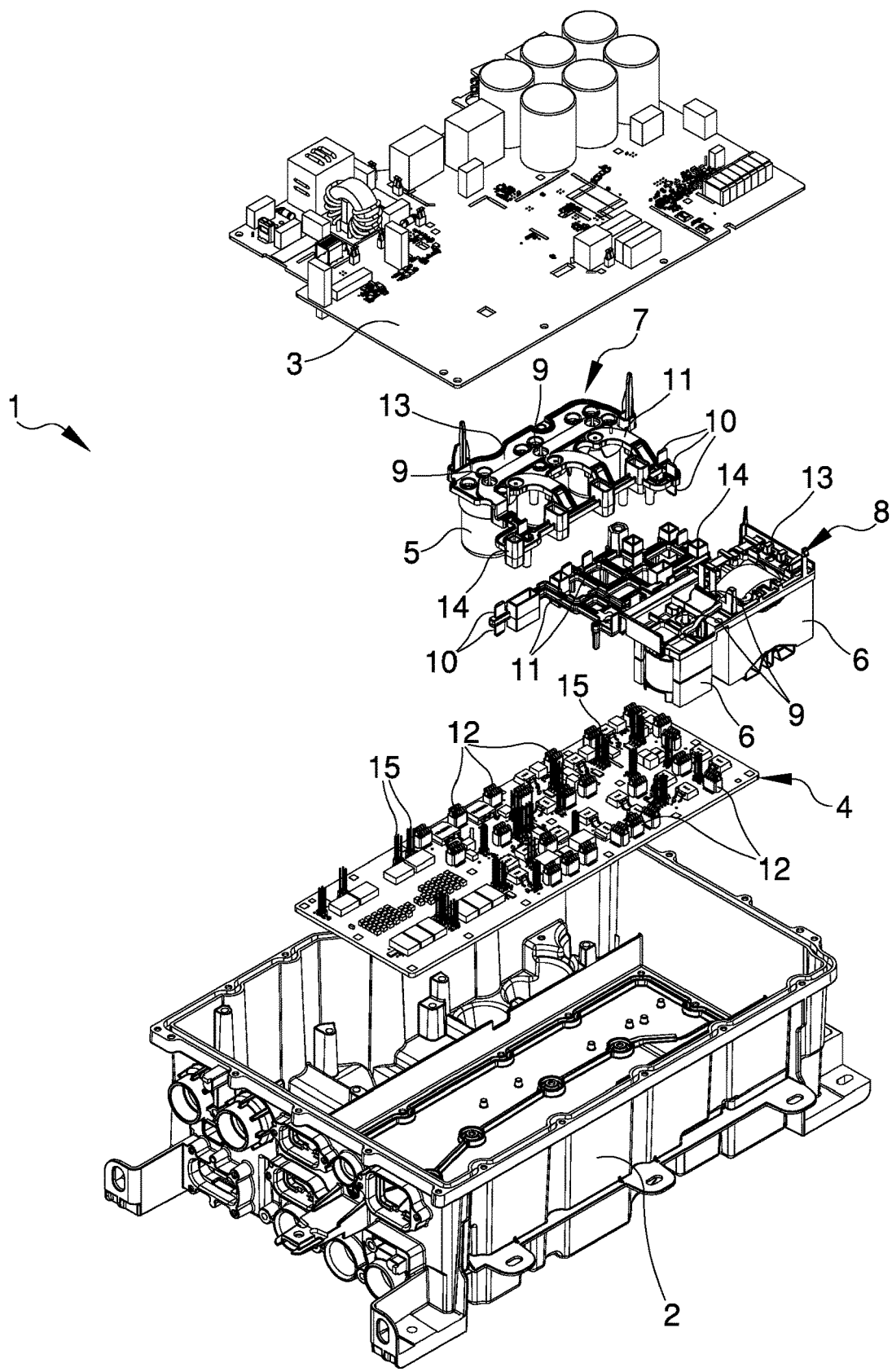
FIG. 2 is an exploded view of the battery charger of FIG. 1.
Figure 3:
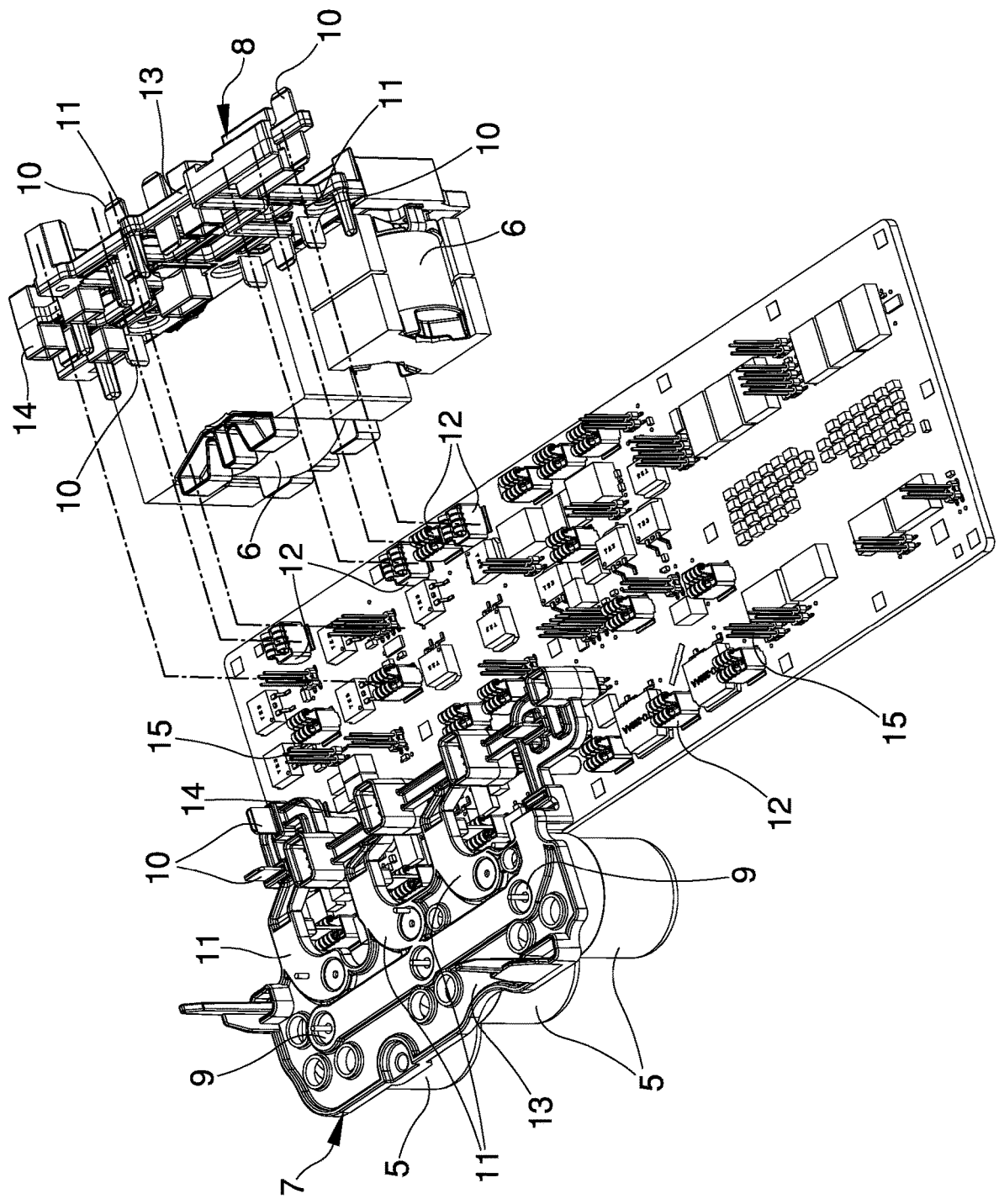
FIG. 3 shows an electronic board and two supports for electric components of the battery charger according to the invention.
Figure 4:
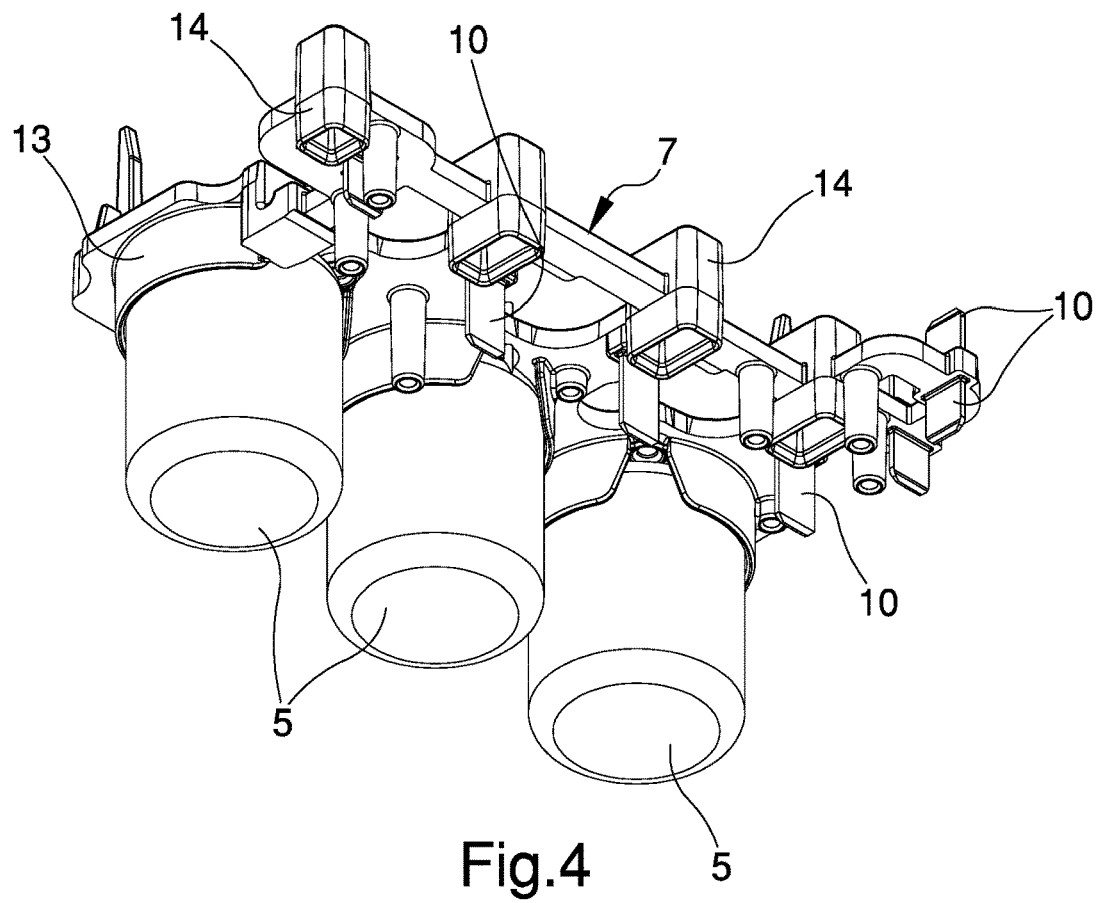
FIG. 4 shows a possible support for electric components of the battery charger according to the invention, particularly suitable for the support of large wound components.
Figure 5:
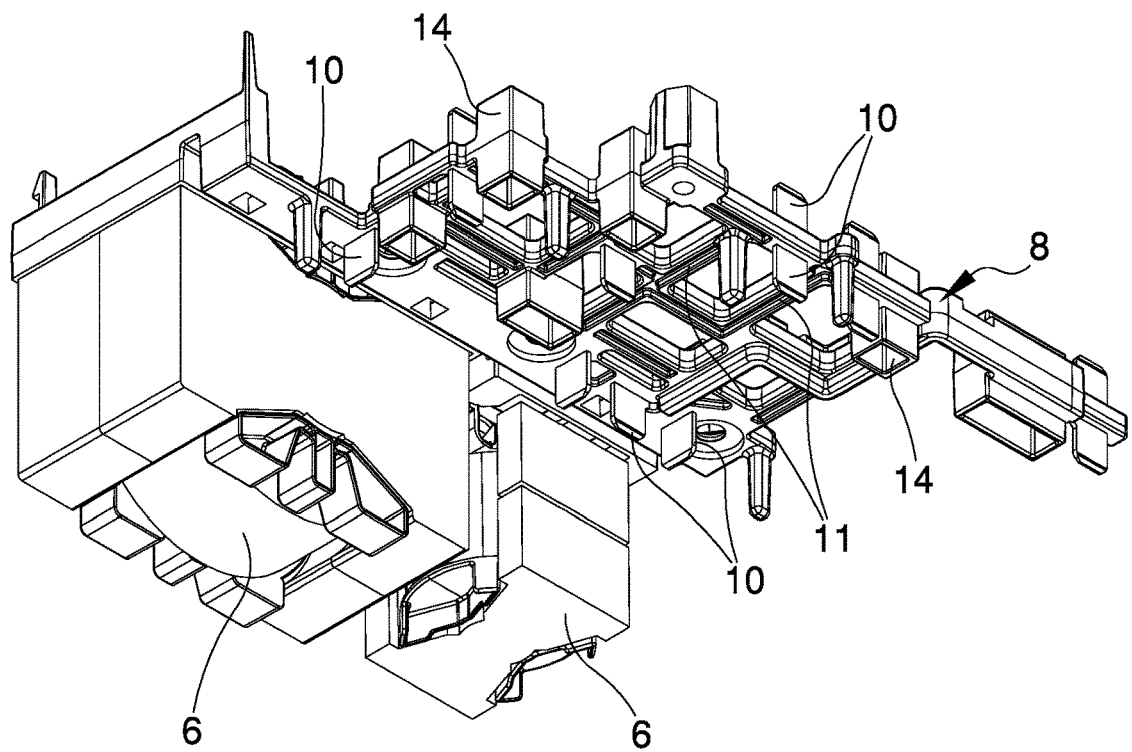
FIG. 5 shows a possible support for electric components of the battery charger according to the invention, particularly suitable for the support of large capacitors.

With particular reference to these illustrations, reference numeral 1 globally indicates a battery charger for vehicles, in particular of the type that can be installed on board of electric, hybrid or similar vehicles and adapted to recharge the battery of the vehicle.

The battery charger 1 comprises an outer container 2, adapted to house and protect the entire electronics of the battery charger itself and adapted to allow the installation and fixing thereof inside the vehicle.

The battery charger 1 also comprises at least one electronic board 3, 4 housed inside the container 2, operatively connectable to an electric battery of a vehicle and configured for the recharge of the battery itself.

With reference to the particular but not limited embodiment shown in the illustrations, the battery charger 1 comprises a first power electronic board 3 and a second IMS electronic board 4, properly connected to each other.

Different embodiments of the battery charger 1 cannot however be ruled out wherein electronic boards of different type and in different number are used.

The battery charger 1 also comprises at least one electric component 5, 6 connected to at least one of the electronic boards 3, 4, and at least one support 7, 8 for housing such at least one electric component 5, 6.

In particular, each support 7, 8 used in the battery charger 1 is adapted to allow supporting one or more electric components 5, 6 while simplifying, at the same time, the correct positioning inside the container 2.

The electric components supported by means of the support 7, 8 may consist of large wound components, such as e.g. a transformer, an inductance or a filter, or large capacitors.

The use of supports for electric components of different type cannot however be ruled out.

Advantageously, the support 7, 8 used in the battery charger 1 according to the invention comprises electric connection means 9, 10, 11 for the connection of the at least one electric component 5, 6 to the electronic board 4.

The presence of the electric connection means 9, 10, 11, in particular, allows connecting the electric components 5, 6 to one or more electronic boards 3, 4 in a quick and easy manner With particular but not exclusive reference to the embodiment shown in the illustrations, the battery charger 1 comprises a first support 7 adapted to support a plurality of capacitors 5, and a second support 8 adapted to support a plurality of wound components 6. The first support 7 and the second support 8 are both associated with the power electronic board 3 and the IMS electronic board 4.

The use of a different number of supports, connected to different electronic boards, and the support, through the same, of different types of electric components in different number cannot however be ruled out.

Advantageously, the electric connection means 9, 10, 11 comprise at least a first electric terminal 9 connected to at least one electric component 5, 6, at least a second electric terminal 10 connected to at least one electronic board 3, 4 and at least one connecting element 11 electrically connecting the first electric terminal 9 to the second electric terminal 10.

Each electronic board 3, 4 is provided with at least one respective attaching terminal 12 for the connection of the second electric terminal 10.

The first electric terminal 9, the second electric terminal 10 and the connecting element 11 are all made on the support 7, 8 itself With reference to the particular embodiment shown in the illustrations, both the first support 7 and the second support 8 comprise respective electric connection means 9, 10, 11.

In particular, the first support 7 comprises a plurality of first electric terminals 9 for the connection of respective capacitors 5, a plurality of second electric terminals 10 connected to respective attaching terminals 12 of the power electronic board 3 and of the IMS electronic board 4, and a plurality of connecting elements 11 for the electric connection of each of the first electric terminals 9 to at least one respective second electric terminal 10.

Similarly, the second support 8 comprises a plurality of first electric terminals 9 for the connection of respective wound components 6, a plurality of second electric terminals 10 connected to respective attaching terminals 12 of the power electronic board 3 and of the IMS electronic board 4, and a plurality of connecting elements 11 for the connection of each of the first electric terminals 9 to at least one respective second electric terminal 10.

Advantageously, each support 7, 8 comprises at least one holding frame 13 of the electric components 5, 6, provided with the electric connection means 9, 10, 11, and suitably shaped so as to allow the correct connection of each electric component 5, 6 to precise and different points of the electronic boards 3, 4.

In particular, the holding frame 13 comprises at least one housing seat for housing a respective electric component 5, 6.

Usefully, the first electric terminal 9 is made at such housing seat of the holding frame 13.

With reference to a particular embodiment, illustrated in the figures, each first electric terminal 9 consists of a connection pad for connecting the terminals of a respective electric component 5, 6.

Advantageously, according to a preferred embodiment, the second electric terminal 10 consists of a first electric connector connected to a corresponding second electric attaching connector 12 of the electronic board.

Preferably, the second electric terminals 10 and the electric attaching connectors 12 are made up of Faston connectors in order to simplify and speed up the assembly and connection operations to the electronic boards 3, 4.

Advantageously, according to a preferred embodiment, the connecting element 11 consists of a conductive element, of the type of a conductive track or a special wiring, made directly on the holding frame 13.

Advantageously, the holding frame 13 is designed to accommodate a plurality of electric components 5, 6 and comprises electric connection means 9, 10, 11 between each of the electric components 5, 6 and each electronic board 3, 4.

In particular, each holding frame 13 comprises a plurality of housing seats of a plurality of electric components 5, 6.

In this way, therefore, each of the supports 7, 8 can hold a plurality of respective electric components 5, 6 and can allow the quick and easy connection of the electric components themselves to each of the electronic boards 3, 4.

Furthermore, the presence of second electric terminals 10 arranged on opposite sides of the holding frame 13 allows the connection of the electric components 5, 6 both to the power electronic board 3 and to the IMS electronic board.

Usefully, according to a possible embodiment, the holding frame 13 comprises at least one interconnecting element 14 which is adapted to interconnect at least one contact 15 present on a first electronic board 3, to at least one respective contact present on a second electronic board 4.

Preferably, this interconnecting element 14 consists of a substantially tubular element which is adapted to accommodate the contact of the first electronic board 4.

The process for the realization of a battery charger for vehicles comprises at least the following steps:
- making at least one electronic board 3, 4 connectable to an electric battery of a vehicle and configured for the recharge of the battery itself;
- connecting at least one electric component 5, 6 to the electronic board 3, 4.

Advantageously, the connection of the at least one electric component 5, 6 to the electronic board 3, 4 is carried out according to the following steps:
- making at least one support 7, 8 for housing the at least one electric component 5, 6, wherein the support 7, 8 is provided with electric connection means 9, 10, 11 between the at least one electric component 5, 6 and the electronic board 3, 4;
- associating the at least one electric component 5, 6 with the support 7, 8, with electric connection between the electric component 5, 6 and the electric connection means 9, 10, 11;
- associating the support 7, 8 with the electronic board 3, 4, with electric connection between the electric connection means 9, 10, 11 and the electronic board 3, 4.

In addition, the process according to the invention comprises the following steps:
- making an outer container 2;
- accommodating and securing said at least one electronic board 3, 4 and said at least one support 7, 8 provided with said electric components 5, 6 inside said container 2.

The use of the support described above with reference to the battery charger 1 in different applications cannot be ruled out, e.g. to support electric components of the same or different type.

In this case, this support comprises electric connection means and at least one holding frame which are similar to the electric connection means 9, 10, 11 and to the holding frame 13 described above.

It has in practice been ascertained that the described invention achieves the intended objects.

In particular, the fact is underlined that the battery charger and the process according to the invention make it possible to simplify the assembly operations, in particular of the large electric components, such as electric wound components or capacitors.

In addition, the battery charger and the process according to the invention allow avoiding connecting errors of the electric wound components.

The invention claimed is:

1. A battery charger for vehicles, the battery charger comprising:
   at least one outer container,
   at least one electronic board housed inside said container, operatively connectable to an electric battery of a vehicle and configured for the recharge of said battery,
   at least one electric component connected to said electronic board, and at least one support for housing said at least one electric component, wherein
   said support comprises electric connection means between said at least one electric component and said electronic board,
   wherein said electric connection means comprise at least a first electric terminal connected to said at least one electric component, at least a second electric terminal connected to said electronic board and at least one connecting element connected to said first electric terminal and to said second eclectic terminal, said first electric terminal, said second electric terminal and said connecting element being made on said support,
   wherein said support comprises at least one holding frame of said at least one electric component, said holding frame comprises at least one housing seat for housing said at least one electric component, and said first electric terminal is made at said housing seat,
   wherein said second electric terminal comprises at least a first electric connector connected to a corresponding second electric connector of said electronic board, and
   wherein said connecting element comprises at least one conductive element made on said holding frame.

2. The battery charger according to claim 1, wherein said first electric terminal comprises at least one pad for connecting the terminals of said at least one electric component.

3. The battery charger according to claim 1, wherein said holding frame comprises a plurality of housing seats of a plurality of electric components.

4. The battery charger according to claim 1, wherein said electric component is a wound component.

5. The battery charger according to claim 4, wherein said wound component is composed of one from a transformer, an inductance or a filter.

6. The battery charger according to claim 1, wherein said electric component is a capacitor.

7. A process for the realization of a battery charger for vehicles, the process comprising at least the following steps:
   making at least one electronic board connectable to an electric battery of a vehicle and configured for the recharge of said battery;
   connecting at least one electric component to said electronic board;
   wherein said step of connecting comprises at least the following steps:
   making at least one support for housing said at least one electric component, said support being provided with electric connection means between said at least one electric component and said electronic board;
   associating said at least one electric component with said support, with electric connection between said electric component and said electric connection means; and
   associating said support with said electronic board, with electric connection between said electric connection means and said electronic board,
   wherein said electric connection means comprise at least a first electric terminal connected to said at least one electric component, at least a second electric terminal connected to said electronic board and at least one connecting element connected to said first electric terminal and to said second eclectic terminal, said first electric terminal, said second electric terminal and said connecting element being made on said support,
   wherein said support comprises at least one holding frame of said at least one electric component, said holding frame comprises at least one housing seat for housing said at least one electric component, and said first electric terminal is made at said housing seat,
   wherein said second electric terminal comprises at least a first electric connector connected to a corresponding second electric connector of said electronic board, and
   wherein said connecting element comprises at least one conductive element made on said holding frame.

8. A support for electric components, the support comprising:
- at least one holding frame provided with at least one housing seat for at least one electric component,
- electric connection means, and
- at least one electronic board, wherein
- said electric connection means being made on said holding frame,
- wherein said electric connection means comprise at least a first electric terminal connected to said at least one electric component, at least a second electric terminal connected to said electronic board and at least one connecting element connected to said first electric terminal and to said second eclectic terminal, said first electric terminal, said second electric terminal and said connecting element being made on said support,
- wherein said support comprises at least one holding frame of said at least one electric component, said holding frame comprises at least one housing seat for housing said at least one electric component, and said first electric terminal is made at said housing seat,
- wherein said second electric terminal comprises at least a first electric connector connected to a corresponding second electric connector of said electronic board, and
- wherein said connecting element comprises at least one conductive element made on said holding frame.

* * * * *